United States Patent [19]

Teshirogi et al.

[11] 4,162,447
[45] Jul. 24, 1979

[54] FREQUENCY SYNTHESIS METHOD FOR AN AM-SSB TRANSMITTER-RECEIVER

[75] Inventors: Toshihiko Teshirogi, Machida; Sumio Tsuruta, Kawagoe, both of Japan

[73] Assignee: Cybernet Electronic Corporation, Kanagawa, Japan

[21] Appl. No.: 793,302

[22] Filed: May 3, 1977

[30] Foreign Application Priority Data

Jun. 30, 1976 [JP] Japan .................................. 51-77178
Jun. 30, 1976 [JP] Japan .................................. 51-77179

[51] Int. Cl.² ............................................. H04B 1/40
[52] U.S. Cl. ........................................ 325/18; 325/25
[58] Field of Search ................... 325/15, 17, 18, 19, 325/20, 21, 25, 50, 137, 330; 331/18

[56] References Cited

U.S. PATENT DOCUMENTS

| | | | |
|---|---|---|---|
| 3,696,422 | 10/1972 | Burrell | 325/17 |
| 3,944,925 | 3/1976 | De Laune | 325/20 |
| 3,983,484 | 9/1976 | Hodama | 325/20 |
| 4,002,995 | 1/1977 | Reed | 325/25 |
| 4,061,973 | 12/1977 | Reimers | 325/17 |

Primary Examiner—Robert L. Griffin
Assistant Examiner—Michael A. Masinick
Attorney, Agent, or Firm—Oblon, Fisher, Spivak, McClelland & Maier

[57] ABSTRACT

A frequency synthesis method for an AM-SSB transmitter-receiver using a phase locked loop type synthesizer, having the steps of supplying a mixer with an offset frequency of an offset oscillator or a multiplied frequency thereof and an output frequency of a voltage-controlled oscillator, applying a difference signal outputted from the mixer to a variable frequency divider, and using a sum signal frequency outputted from the mixer as the local oscillation frequency of the receiver section and that of a mixer of the transmitter section where a transmitting frequency is produced.

2 Claims, 1 Drawing Figure

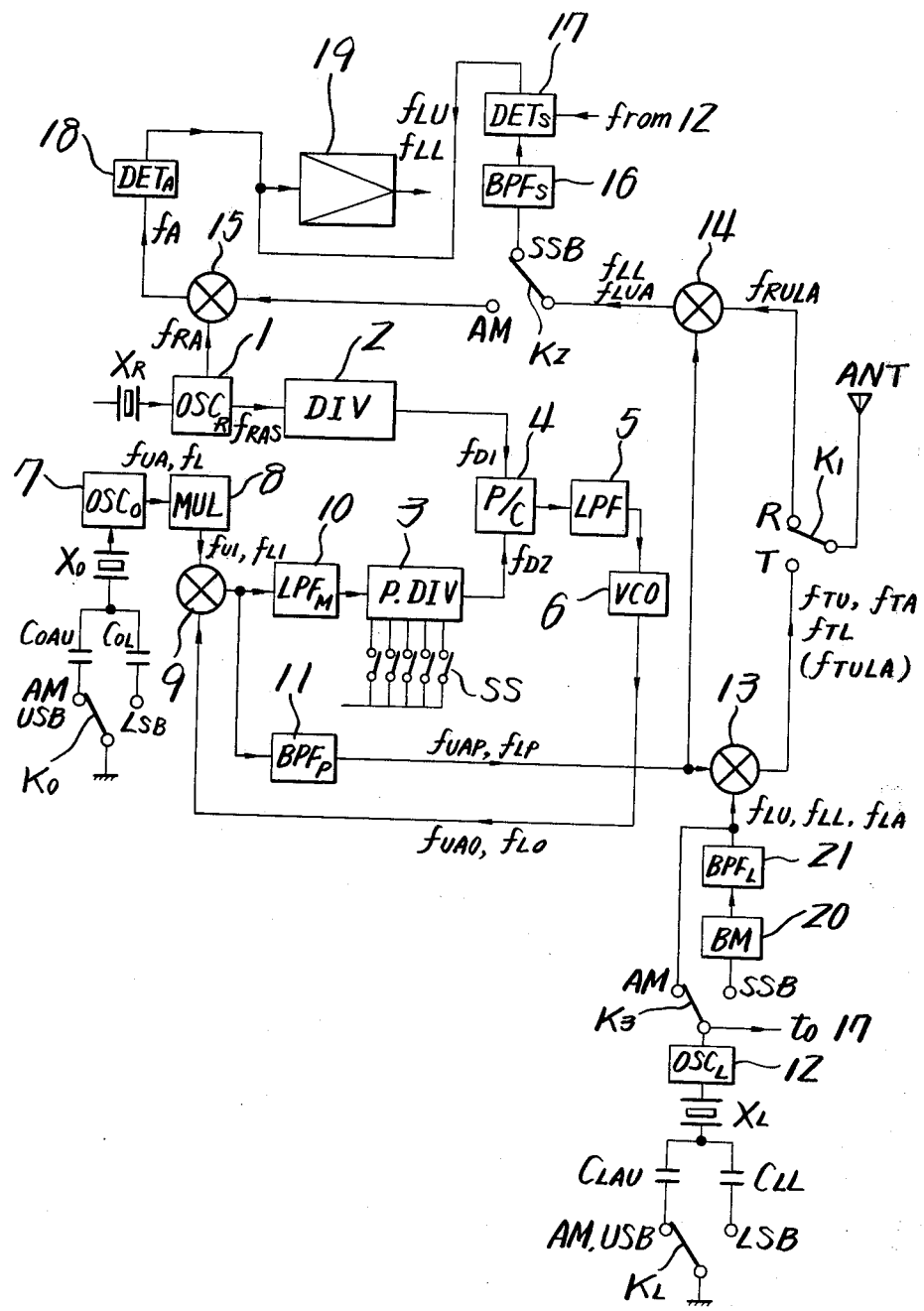

FREQUENCY SYNTHESIS METHOD FOR AN AM-SSB TRANSMITTER-RECEIVER

BACKGROUND OF THE INVENTION

The present invention relates to a frequency synthesis method for an AM-SSB transmitter-receiver having a phase locked loop (PLL) synthesizer and, more particularly, to a frequency synthesis method for an AM-SSB transmitter-receiver excellent in stability, spurious properties and economy using two kinds of frequencies including a frequency for producing an AM carrier frequency and the upper sideband of SSB, selected in common in the frequency control system of the PLL synthesizer before modulation, and for producing the lower sideband of SSB.

In the SSB system, an offset oscillator and a mixer are used for producing an offset frequency signal whose upper and lower sidebands are apart from each other; when carrier frequencies are not to be synthesized from the sum of the offset frequency and voltage-controlled oscillation frequency and the difference therebetween, it is necessary to install additional mixers and crystal oscillators with economical difficulties in consideration of the economical optimum operating conditions of the crystal oscillator, spurious properties and optimum frequency applicable to the variable frequency divider; and carrier frequencies for transmission and reception are produced from the reference frequency, offset frequency and voltage-controlled oscillation frequency, and therefore it is necessary to give as high frequencies as possible to the upper and lower sideband frequencies so as to prevent deterioration of the spurious properties.

SUMMARY OF THE INVENTION

It is the main object of the present invention to provide a frequency synthesis method for an AM-SSB transmitter-receiver which can achieve stable frequency synthesis most economically and can give excellent spurious properties.

According to the present invention, carrier frequencies for transmission and reception are synthesized from two kinds of frequencies including a frequency serving both as an AM frequency and an upper sideband frequency of SSB, and a lower sideband frequency of SSB. If the carrier frequency for transmission and reception is 27 MHz, for instance, the lower and upper sideband frequencies of SSB are made to shift toward the lower and higher frequency sides from 27 MHz, respectively. In the case of AM frequencies, the frequency range is expanded by an audio frequency bandwidth toward the upper and lower frequency sides from 27 MHz, respectively, depending upon frequencies determined from the voice frequency range, filter characteristics, etc. The offset frequency is selected as low as possible so as to make the oscillation frequency of the crystal oscillator variable in a wide range. The transmitting and receiving carrier frequencies are synthesized from the sum of or difference between the offset frequency or multiplied frequency thereof and the output frequency of the voltage-controlled oscillator.

BRIEF DESCRIPTION OF THE DRAWING

The single FIGURE is a circuit diagram for explaining one embodiment of the present invention.

DESCRIPTION OF THE PREFERRED EMBODIMENT

Now the present invention will be hereinafter described in detail with reference to the accompanying drawing.

In the drawing, the reference numeral 1 designates a reference oscillator ($OSC_R$) for applying reference oscillation frequencies $f_{RA}$ and $f_{RAS}$ for both AM and SSB to a fixed frequency divider 2 (DIV) and a second mixer 15 of the receiver section, respectively. A divided frequency $f_{D1}$ outputted from the fixed frequency divider 2 is given to a phase detector 4 (P/C). Reference numeral 7 designates an offset-frequency oscillator ($OSC_O$) used for AM and SSB in common, which supplies offset frequencies $f_{UA}$ and $f_L$ to a frequency multiplier 8 (MUL), the frequency $f_{UA}$ being applied to AM and the upper sideband USB of SSB and the frequency $f_L$ to the lower sideband LSB of SSB. Output frequencies $f_{UI}$ and $f_{LI}$ of the frequency multiplier 8 are applied to a mixer 9, the output of which is supplied to a low-pass filter 10 where it is filtered. Filtered frequencies outputted from the low-pass filter 10 are applied to a variable frequency divider 3 where a divided-frequency output $f_{D2}$ corresponding in frequency to the above-mentioned divided frequency $f_{D1}$ is produced. The divided frequency $f_{D2}$ is fed to the phase detector 4 where the frequencies $f_{D1}$ and $f_{D2}$ are compared. Then the output of the phase detector 4 is supplied to a voltage-controlled oscillator 6 through a low-pass filter 5. Frequencies $f_{UAO}$ and $f_{LO}$ outputted from the voltage-controlled oscillator are fed back to the mixer 9 where they are mixed with frequencies $f_{UI}$ and $f_{LI}$ outputted from the frequency multiplier 8, respectively. Signals indicative of the difference between frequencies $f_{UAO}$ and $f_{UI}$ and that between frequencies $f_{LO}$ and $f_{LI}$ are fed to the low-pass filter 10 from the mixer 9, respectively; and, in addition, the sum $f_{UAP}$ of frequencies $f_{UAO}$ and $f_{UI}$ and the sum $f_{LP}$ of frequencies $f_{LO}$ and $f_{LI}$ are applied through a band-pass filter 11 to a local oscillation mixer 13 of the transmitter section where transmitting frequencies are produced, and also to a first mixer 14 of the receiver section. Reference numeral 12 designates a local oscillator ($OSC_L$) for common use in AM and SSB. When an AM-SSB change-over switch $K_3$ is set to the SSB side, local oscillation frequencies $f_{LU}$, $f_{LL}$ and $f_{LA}$ are applied to the above local oscillation mixer 13 through a balanced modulator 20 and a band-pass filter 21; and when the AM-SSB change-over switch $K_3$ is set to the AM side, the above local oscillation frequencies are supplied directly to the mixer 13. Output carrier frequencies $f_{TU}$, $f_{TL}$ and $f_{TA}$ are supplied from the mixer 13 to the transmitting terminal T of a transmit-receive switch $K_1$. From the receiving terminal R of the switch $K_1$, receiving carrier frequencies $f_{RU}$, $f_{RL}$ and $f_{RA}$ are supplied to the first mixer 14 where they are mixed with the above sum-signal frequencies $f_{UAP}$ and $f_{LP}$. Output frequencies $f_{LUA}$ and $f_{LL}$ of the first mixer 14 is applied to an AM-SSB change-over switch $K_2$ of the receiver section. When the switch $K_2$ is set to the AM side for AM reception, the output frequencies $f_{LUA}$ and $f_{LL}$ are fed to the second mixer 15 of the receiver section where they are mixed with the reference frequency $f_{RA}$. AM frequencies outputted from the second mixer 15 are fed to a detector 18 and to an audio frequency amplifier 19; and when the switch $K_2$ is set to the SSB side for SSB reception, they are supplied to the audio frequency amplifier 19 through a band-pass filter 16 and a detector 17 while being synthesized into the same frequencies as the local oscillation frequencies $f_{LU}$ and $f_{LL}$ respectively. Change-over switches $K_O$ and $K_L$ interlocked with each other are installed to give frequency shifts equivalent to the band widths of the above-mentioned band-pass filters either for AM and USB or for LSB.

The above-mentioned frequency synthesis method or system will be hereinafter described using actual values, by way of example. The example shown in the following table is obtained on the assumption that the intermediate frequency $f_A = 455$ KHz and the frequency $f_{RULA} = f_{TULA} = 26,965$ MHz are to be produced on the basis of the the transmitting or receiving carrier frequency = 27 MHz and that the band width between the USB and LSB of SSB is 3 KHz.

|  | Frequency for AM or USB | Frequency for LSB |
|---|---|---|
| Reference oscillation frequency | $f_{RA}$: 10.24 MHz | |
| Offset oscillation frequncy | $f_{UA}$: 10.0525 | $f_L$: 10.05175 |
| Multiplied frequency (doubled) | $f_{UF}$ 20.105 | $f_{LF}$ 20.1035 |
| Voltage-controlled oscillation frequency | $f_{UAO}$: 17.555 | $f_{LO}$: 17.5535 |
| Mixer output Sum signal | $f_{UAF}$: 20.105 + 17.555 | $f_{LF}$: 20.1035 + 17.5535 |
| Difference signal | 20.105 − 17.555 | 20.1035 − 17.5535 |
| Local oscillation frequency | $f_{LU}, f_{LA}$: 10.695 | $f_{LL}$: 10.692 |
| Receiver section's first mixer output frequency | 37.66 − 26.965 = 10.695 ($f_{LUA}$) | 37.657 − 26.965 = 10.692 ($f_{LL}$) |
| Carrier frequency for transmission and reception | $f_{RULA}$: 26.965 MHz $f_{TULA}$: 26.965 | |
| Divided frequency | $f_{D1}$: 10 KHz $f_{D2}$: 10 KHz | |
| Intermediate frequency for AM | $f_A$: 455 KHz | |

It will be understood from the foregoing description that the method of the present invention selects relatively low offset frequencies in order to produce carrier frequencies for transmission and reception synthesized by the PLL synthesizer and therefore can achieve frequency synthesis suitable for the economical operating characteristics of the crystal oscillator, variable frequency divider and voltage-controlled oscillator; that it can produce stable synthesized frequencies and achieve improvements in spurious properties though high carrier frequencies are selected on the basis of the voltage-controlled oscillation frequencies and multiplied frequencies, by shifting the offset frequency and the local oscillation frequency of the transmitter section by a frequency equivalent to the band width of the SSB signal; and that it can reduce the number of crystal oscillators and improve performance and economy as a whole.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A frequency synthesis method for transmission and reception of AM-SSB signals using a PLL synthesizer in a AM-SSB transceiver having a transmitter section and a receiver section which comprises the steps of:
   during the transmission of AM and first sideband signals, supplying a mixer with an offset frequency of an offset oscillator and an output frequency of a voltage-controlled oscillator;
   applying a difference signal frequency outputted from said mixer to a variable frequency divider in the PLL synthesizer;
   using a sum signal frequency outputted from said mixer as the local oscillation frequency of the receiver section and as an input to a mixer of the transmitter section where a transmitting frequency is produced;
   supplying the mixer of the transmitter section with a transmitter section local oscillation frequency as a further input; and
   for the transmission of the other sideband signal, simultaneously shifting both the offset frequency and the transmitter section local oscillation frequency by predetermined amounts.

2. A frequency synthesis method for transmission and reception of AM-SSB signal using a PLL synthesizer in a AM-SSB transceiver having a transmitter section and a receiver section which comprises the steps of:
   during the transmission of AM and a first sideband signal, supplying a mixer with a multiple of an offset frequency of an offset oscillator and an output frequency of a voltage-controlled oscillator;
   applying a difference signal frequency outputted from said mixer to a variable frequency divider in the PLL synthesizer;
   using a sum signal frequency outputted from said mixer as the local oscillation frequency of the receiver section and as an input to a mixer of the transmitter section where a transmitting frequency is produced;
   supplying the mixer of the transmitter section with a transmitter section local oscillation frequency as a further input; and
   for the transmission of the other sideband signal, simultaneously shifting both the said offset frequency and the transmitter section local oscillation frequency by predetermined amounts.

* * * * *